United States Patent
Yan et al.

(10) Patent No.: US 9,324,868 B2
(45) Date of Patent: Apr. 26, 2016

(54) EPITAXIAL GROWTH OF SILICON FOR FINFETS WITH NON-RECTANGULAR CROSS-SECTIONS

(71) Applicant: GLOBALFOUNDRIES Inc., Grand Cayman (KY)

(72) Inventors: Ran Ruby Yan, Dresden (DE); Ralf Richter, Dresden (DE); Jan Hoentschel, Dresden (DE); Hans-Jurgen Thees, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/463,057

(22) Filed: Aug. 19, 2014

(65) Prior Publication Data

US 2016/0056294 A1 Feb. 25, 2016

(51) Int. Cl.

| | |
|---|---|
| H01L 21/00 | (2006.01) |
| H01L 21/84 | (2006.01) |
| H01L 29/78 | (2006.01) |
| H01L 29/66 | (2006.01) |
| H01L 21/762 | (2006.01) |
| H01L 21/306 | (2006.01) |
| H01L 21/02 | (2006.01) |
| H01L 29/06 | (2006.01) |

(52) U.S. Cl.
CPC ...... *H01L 29/7853* (2013.01); *H01L 21/02532* (2013.01); *H01L 21/02587* (2013.01); *H01L 21/02639* (2013.01); *H01L 21/30608* (2013.01); *H01L 21/30625* (2013.01); *H01L 21/76224* (2013.01); *H01L 21/76283* (2013.01); *H01L 29/0653* (2013.01); *H01L 29/66795* (2013.01); *H01L 29/7855* (2013.01)

(58) Field of Classification Search
CPC .................................................. H01L 29/7854
See application file for complete search history.

(56) References Cited

U.S. PATENT DOCUMENTS

| | | | | |
|---|---|---|---|---|
| 2008/0237575 | A1* | 10/2008 | Jin et al. ........................... | 257/19 |
| 2011/0073952 | A1* | 3/2011 | Kwok et al. ................... | 257/368 |
| 2012/0025313 | A1* | 2/2012 | Chang et al. ................... | 257/347 |
| 2012/0217467 | A1* | 8/2012 | Tan et al. ........................... | 257/9 |
| 2013/0049068 | A1* | 2/2013 | Lin ...................... | H01L 29/7853 257/192 |
| 2013/0228875 | A1* | 9/2013 | Lee et al. ....................... | 257/401 |
| 2013/0244396 | A1* | 9/2013 | Oh et al. ........................ | 438/400 |
| 2013/0334606 | A1* | 12/2013 | Shen et al. ..................... | 257/368 |
| 2014/0239354 | A1* | 8/2014 | Huang et al. ................... | 257/288 |
| 2014/0312427 | A1* | 10/2014 | Maeda ................. | H01L 27/0924 257/369 |
| 2015/0091099 | A1* | 4/2015 | Ching ............. | H01L 21/823431 257/401 |
| 2015/0132908 | A1* | 5/2015 | Jeong ................. | H01L 29/66795 438/283 |

* cited by examiner

*Primary Examiner* — Angel Roman
(74) *Attorney, Agent, or Firm* — Ditthavong & Steiner, P.C.

(57) ABSTRACT

FinFET devices with epitaxially grown fins and methods for fabricating them are provided. Embodiments include forming at least two shallow trench isolation (STI) regions, filled with dielectric material, adjacent to but separate from each other in a silicon substrate; epitaxially growing a silicon-based layer between each adjacent pair of STI regions to form a fin with a non-rectangular cross-section extending from each STI region to each adjacent STI region; forming a gate oxide over and perpendicular to each fin; and forming a gate electrode over the gate oxide to form a FinFET.

13 Claims, 3 Drawing Sheets

BACKGROUND

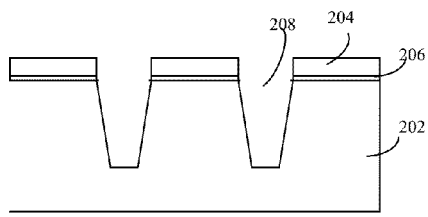
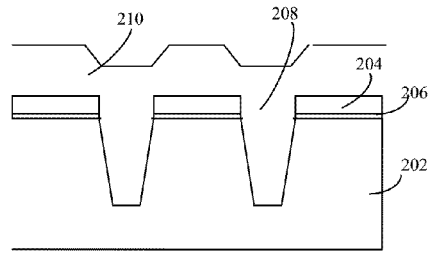
FIG. 2A
FIG. 2B
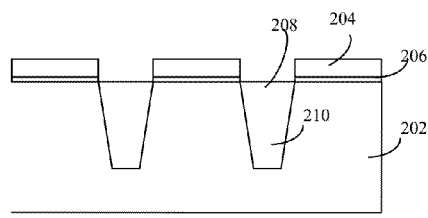
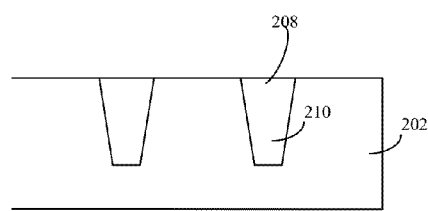
FIG. 2C
FIG. 2D
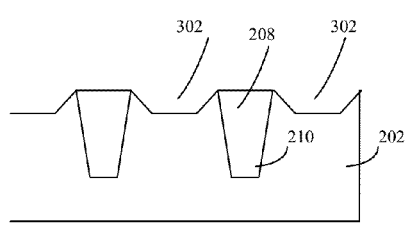
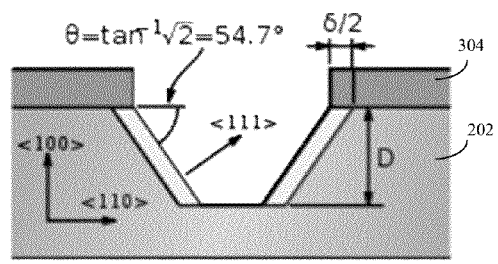
FIG. 3A
FIG. 3B

EPITAXIAL GROWTH OF SILICON FOR FINFETS WITH NON-RECTANGULAR CROSS-SECTIONS

TECHNICAL FIELD

The present disclosure relates to fin field-effect transistors (FinFETs). In particular, the present disclosure relates to epitaxially growing silicon fins for FinFETs.

BACKGROUND

In contrast to traditional planar metal-oxide-semiconductor field-effect transistors (MOSFETs), which are fabricated using conventional lithographic fabrication methods, non-planar FETs incorporate various vertical transistor structures. One such transistor structure is the FinFET, which takes its name from the multiple thin silicon "fins" that are used to form the respective gate channels, and which are typically on the order of tens of nanometers in width. For example, FIG. 1 illustrates a simplified perspective view of a FinFET 100, which is formed on a semiconductor silicon substrate 102 and a dielectric material such as silicon dioxide ($SiO_2$) 104. The silicon substrate 102 includes a rectangular shaped fin 106, which extends from a source region 108, through a channel region 110, to a drain region 112. These regions are formed of one or more n-type or p-type doped semiconductor materials. As shown, channel region 110 is surrounded on the top and on each side by a gate electrode 114. The combined top and side surface areas of the channel region 110 determine the effective channel of the FinFET 100. The gate electrode 114 is isolated from the fin 106 via a gate oxide (not shown for illustrative convenience). When switched on, the gate electrode 114 provides a path (conducting channel) for current to flow from the source region 108 to the drain region 112.

One of the goals of the semiconductor industry is to increase the on current of individual FinFETs while decreasing their size. For transistors, the on current is given by equation I:

$$I_{on} \approx \mu C_{ox} \frac{W_{si}}{L_g}(V_{dd} - V_{th})^2, \quad (I)$$

where $W_{si}$ is the width of the device, i.e. the width of the area underneath the gate, $L_g$ is the gate length, $V_{dd}$ is the supply voltage, $\mu$ is the carrier mobility and $C_{ox}$ is the gate oxide capacitance. A known approach for increasing the on current is to increase the width of the device under the gate. To put more transistors into a FinFET without increasing its surface area, many structures have been developed that increase the width of the device in the vertical direction, e.g. double-gate, triple-gate, quadruple-gate, cylindrical-gate, independent-gate/extremely thin silicon-on-insulator (ETSOI), and bulk FinFET devices. However, structures that increase the width in the vertical direction, (e.g. double-gate, triple-gate, quadruple-gate, cylindrical-gate, independent-gate/ETSOI, and bulk FinFET devices) require growing a uniform nanowire, which includes expensive and complicated integration steps. Further modifications of these structures, accordingly, are needed to meet the increasing goals of the industry.

A need therefore exists for methodology enabling the increase of on current of a FinFET without increasing its size, and the resulting device.

SUMMARY

An aspect of the present disclosure is a method of forming a FinFET having a fin with a non-rectangular cross-section by epitaxially growing the fin.

Another aspect of the present disclosure is a FinFET having an epitaxially grown fin with a non-rectangular cross-section.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming at least two shallow trench isolation (STI) regions, filled with dielectric material, adjacent to but separate from each other in a silicon substrate; epitaxially growing a silicon-based layer between each adjacent pair of STI regions to form a fin with a non-rectangular cross-section extending from each STI region to each adjacent STI region; forming a gate oxide over and perpendicular to each fin; and forming a gate electrode over the gate oxide to form a FinFET.

Aspects of the present disclosure also include the silicon substrate as a silicon-on-insulator (SOI) or bulk silicon substrate. Other aspects include the dielectric material being silicon dioxide ($SiO_2$). Still other aspects include an epitaxially grown silicon-based layer as a p-type or n-type doped silicon. Further aspects include anisotropically wet etching the silicon substrate from each STI region to each adjacent STI region to form a channel between each pair of adjacent STI regions and epitaxially growing the silicon-based layer in each channel. Still further aspects include planarizing the silicon substrate by chemical-mechanical planarization (CMP) prior to anisotropically wet etching the silicon substrate. Additional aspects include anisotropically wet etching the silicon substrate with potassium hydroxide (KOH), ethylene diamine and pyrocatechol (EDP), or tetramethylammonium hydroxide (TMAH). Still additional aspects include epitaxially growing the silicon-based layer to form a fin with a diamond-shaped cross-section in each channel. Other aspects include performing a well implantation between each pair of adjacent STI regions subsequent to epitaxially growing the silicon-based layer but prior to forming the gate oxide. Still other aspects include performing a well implantation between each pair of adjacent STI regions prior to anisotropically wet etching the silicon substrate. Further aspects include epitaxially growing the silicon-based layer to form a fin with a semi-elliptical cross-section between each pair of adjacent STI regions. Still further aspects include performing a well implantation between each pair of adjacent STI regions prior to epitaxially growing the silicon-based layer.

Another aspect of the present disclosure includes a FinFET having: a silicon substrate; at least two adjacent but separate STI regions in the silicon substrate; a channel formed in the silicon substrate extending from each STI region to each adjacent STI region, the channel having a trapezoidal cross-section; a fin with a non-rectangular cross-section filling and extending above each channel, wherein each fin is an epitaxially grown silicon-based layer; a gate oxide over and perpendicular to each fin; and a gate electrode over the gate oxide. Aspects also include each fin having a diamond-shaped cross section. Other aspects include the silicon substrate as a SOI or bulk silicon substrate. Still other aspects include having at least one additional gate electrode over and perpendicular to each fin, wherein the FinNET is a multi-gate FinFET.

Another aspect of the present disclosure includes a FinFET having: a silicon substrate; at least two adjacent but separate STI regions in the silicon substrate; a fin with a non-rectangular cross-section extending above the silicon substrate extending from each STI region to each adjacent STI region, wherein each fin is an epitaxially grown silicon-based layer; a gate oxide over and perpendicular to each fin; and a gate electrode over the gate oxide. Aspects also include each fin having a semi-elliptical cross-section. Other aspects include the silicon substrate as a silicon-on-insulator (SOI) or bulk silicon substrate. Still other aspects include having at least one additional gate electrode over and perpendicular to each fin, wherein the FinNET is a multi-gate FinFET.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2D illustrate a process for preparing a silicon substrate for a FinFET;

FIGS. 3A and 3B illustrate an anisotropically wet etched silicon substrate channel;

DETAILED DESCRIPTION

Figure 1:
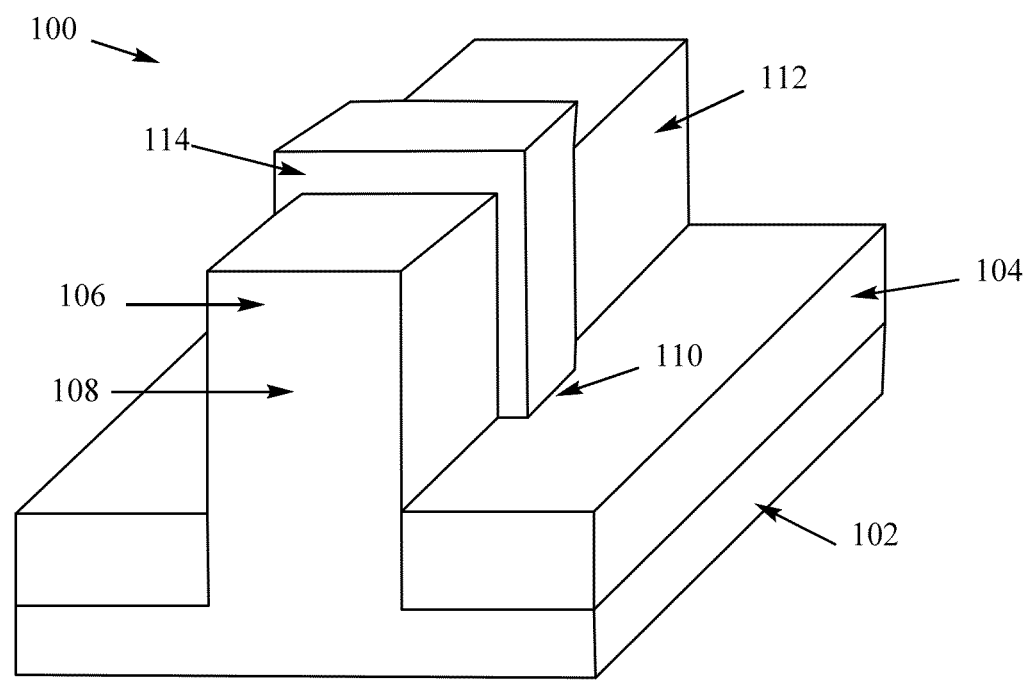
FIG. 1 illustrates a conventional FinFET device.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a complicated and expensive process of growing a uniform nanowire attendant upon increasing the device width in the vertical direction. In accordance with embodiments of the present disclosure, a fin with a non-rectangular cross section, which increases the width of the device and therefore, the on current and performance of the device is formed with a single epitaxial deposition step and, in one embodiment, a single anisotropic wet etching step.

Methodology in accordance with embodiments of the present disclosure includes forming at least two STI regions, filled with dielectric material, adjacent to but separate from each other in a silicon substrate. A silicon-based layer is epitaxially grown between each adjacent pair of STI regions to form a fin with a non-rectangular cross-section extending from each STI region to each adjacent STI region. A gate oxide is formed over and perpendicular to each fin, and a gate electrode is formed over the gate oxide to form a FinFET.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2D illustrate a process for preparing a silicon substrate for a FinFET. As shown in FIG. 2A, a silicon substrate 202 (SOI or bulk silicon) can be selectively masked with a silicon nitride ($Si_3N_4$) pad 204 and a pad oxide 206, such as silicon dioxide ($SiO_2$). The silicon nitride pad 204 acts as a sacrificial vertical spacing layer and reduces oxidation of the silicon substrate 201. The pad oxide 206 reduces damage to the silicon substrate 202 during formation of the silicon nitride pad 204. The silicon nitride pad 204 and pad oxide 206 may be of any suitable size. For example, the silicon nitride pad 204 may be from 250 angstroms (Å) to 1,000 Å thick, and the pad oxide 206 may be from 30 Å to 70 Å thick. The silicon substrate 202 is etched through the silicon nitride and pad oxide mask to provide at least two STI regions 208. The STI regions 208 may be placed in a linear, parallel arrangement on the silicon substrate 202 or in any other suitable arrangement. Appropriate placement, size, and depth of the STI regions 208 in the silicon substrate 202 are variable depending on the needs and functions of the device. Lithography techniques, such as mask overlap and STI etching, are commonly used in silicon wafer fabrication processes.

FIG. 2B illustrates the silicon nitride pad 204 and STI regions 208 covered with one or more dielectric materials 210, such as silicon dioxide. As shown, excess silicon dioxide 210 covers the silicon nitride pad 204 and also fills and covers the STI regions 208.

Adverting to FIG. 2C, the excess silicon dioxide 210, the silicon nitride pad 204, and pad oxide 206 are then removed from the silicon substrate 202, for example using hydrofluoric acid (HF), leaving the STI regions 208 filled with silicon dioxide 210 exposed. A planarization process, such as chemical-mechanical planarization (CMP) may be used to planarize or smooth the surface of the filled STI regions 208 as well as the surface of the resulting silicon substrate 202. FIG. 2D illustrates the silicon nitride pad 204 and excess silicon dioxide 210 removed from the silicon substrate 202 with STI regions 208 filled with silicon dioxide 210.

As illustrated in FIG. 3A, silicon substrate 202 is anisotropically wet etched, between each pair of adjacent STI regions 208 filled with silicon dioxide 210. The etching results in a channel 302 with a trapezoidal cross-section.

FIG. 3B illustrates a model of an anisotropically wet etched silicon substrate 202 with a channel 302 with a trapezoidal cross-section. As shown in this figure, the top material is an etch mask 304, such as a silicon nitride, and the lower material is the anisotropically wet etched silicon substrate 202. Wet etchants etch crystalline materials at different rates depending upon which crystal face is being exposed. This effect can allow for very high anisotropy for single-crystal materials such as silicon wafers. As shown in FIG. 3B, etching a silicon surface through a rectangular hole in a masking material, for example a rectangular hole in a layer of silicon nitride, creates a channel with flat sloping oriented sidewalls (111) and a flat oriented bottom (100). The oriented sidewalls (111) have an angle to the surface of the wafer of $\theta = \tan^{-1}\sqrt{2} = 54.7°$. The defined crystal structure of the silicon wafer leads to low variation of the etch angle $\theta$.

Several anisotropic wet etchants are available for etching silicon. Different etchants have different anisotropies. For example, potassium hydroxide (KOH) in isopropanol (IPA) displays an etch rate selectivity 400 times higher in the (100) crystal direction than in the (111) direction. Aqueous solutions of ethylene diamine and pyrocatechol (EDP) display an etch rate selectivity 17 times higher in the (100) crystal direction than in the (111) direction. Tetramethylammonium hydroxide (TMAH) provides a safer alternative to ethylene diamine and pyrocatechol, with an etch rate selectivity 37 times higher in the (100) crystal direction than in the (111) direction. Common anisotropic etchants for silicon are shown in Table I:

TABLE I

| Etchant | Operating Temp. (° C.) | $R_{100}$ (μm/min) | $S = R_{100}/R_{111}$ | Mask Materials |
|---|---|---|---|---|
| KOH/IPA | 50 | 1.0 | 400 | $Si_3N_4$, $SiO_2$ |
| EDP | 110 | 0.47 | 17 | $Si_3N_4$, $SiO_2$, Cr, Ag, Cu |
| TMAH | 80 | 0.6 | 37 | $Si_3N_4$, $SiO_2$ |

Figure 4:
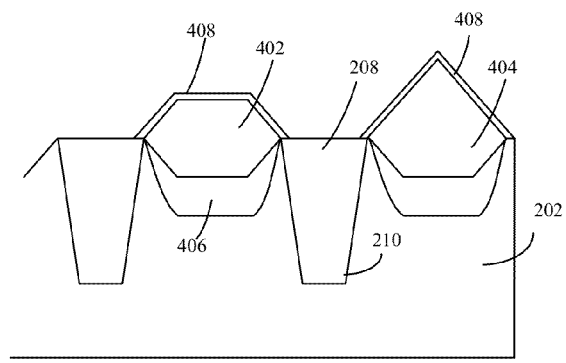
FIG. 4 illustrates epitaxial growth of silicon in an anisotropically wet etched silicon substrate channel, in accordance with an exemplary embodiment.

Next, silicon is epitaxially grown in each channel 302, as illustrate in FIG. 4. The epitaxial layer may be a p-type or n-type doped silicon by adding impurities to the source gas, such as arsenic, phosphorus, or boron. However, undoped silicon provides higher mobility. As shown in FIG. 4, the silicon grows in and over channels 302 forming fins 402 and 404 with diamond shaped cross-sections. The particular shape of the fins depends on the length of time during which the silicon is grown. Fin 404 represents a longer deposition and the maximum growth. Each of the fins 402 and 404 may be from 10 nm to 70 nm in height above the surface of the substrate 202. Further, for 28 nm technologies, each fin may be from 57 nm to 6 micron (μ) in width, for example 100 nm for SRAMs. The length of the fins may be defined by the gate length, which can be down to 7 nm and up to 3 μm. The pitch of the fins (in the width direction) equals the STI width, which can be down to 20 nm and up to 1 μm, for example between 130 nm to 140 nm.

In addition, well implantation 406 may occur between each pair of adjacent STI regions 208 prior to anisotropically wet etching the silicon substrate 202, or well implantation 406 may occur between each pair of adjacent STI regions 208 subsequent to epitaxially growing a silicon-based layer but prior to forming a gate oxide 408, the next step in the process.

A gate oxide 406 may be formed over and perpendicular to each fin 402 and 404, followed by various additional process steps known in the art (not shown for illustrative convenience) to complete the FinFET. For example, the process steps may include forming a gate electrode over the gate oxide, forming spacers on sidewalls of the gate electrode, and performing halo/extension implantations. For multi-gate FinFETs, at least one additional gate electrode over and perpendicular to each fin is present.

Figure 5A:
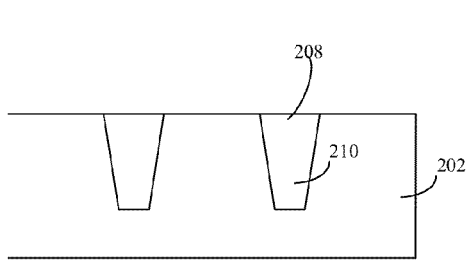
FIGS. 5A and 5B illustrate a process for preparing a FinFET device, in accordance with another exemplary embodiment.
Figure 5B:
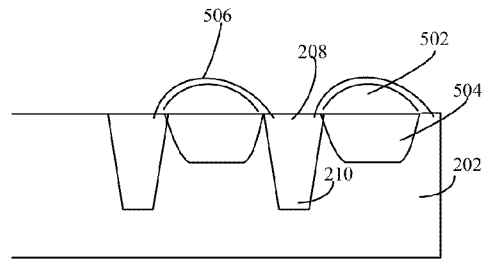

FIGS. 5A and 5B illustrate a process for preparing a FinFET having a fin with a non-rectangular cross-section on an SOI or bulk silicon substrate 202, in accordance with another exemplary embodiment. As illustrated in FIG. 5A, the process begins with substrate 202 and STI regions 208 filled with silicon dioxide 210, as shown in FIG. 2D. Silicon may be deposited and epitaxially grown on the silicon substrate 202 between STI regions 208 resulting in fins 502. The silicon grows more in the center than close to the STI regions, forming fins with semi-elliptical cross-sections. Well implantation 504 may occur between each pair of adjacent STI regions 208 prior to epitaxial silicon growth, or well implantation 504 may occur between each pair of adjacent STI regions 208 subsequent to epitaxially growing silicon but prior to forming a gate oxide 506 over and perpendicular to each fin 502, the next step in the process. Various additional process steps known in the art may be used to complete the FinFET. For example, the process steps may include forming a gate electrode over the gate oxide 506, forming spacers on sidewalls of the gate electrode, and performing halo/extension implantations. For multi-gate FinFETS, at least one additional gate electrode over and perpendicular to each fin is present. The fins 502 may increase the effective width of the device by approximately 20%.

Figure 6:
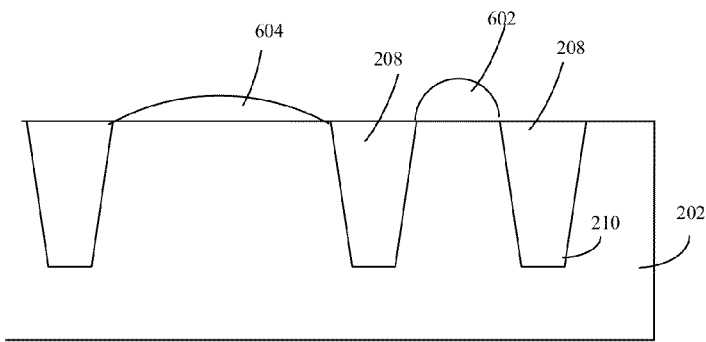
FIG. 6 illustrates a non-rectangular fin between adjacent STI regions on a silicon substrate, in accordance with an exemplary embodiment.

FIG. 6 illustrates examples of two fins 602 and 604 between differently spaced adjacent STI regions 208 on a silicon substrate 202. Due to the nature of epitaxial silicon deposition, narrow silicon surfaces (i.e., between closely spaced STI regions) provide more top rounded fins 602, whereas larger silicon surfaces have relatively shallower rounded fins 604. Therefore, fins 602 have a larger increase in effective device width than fins 604.

The embodiments of the present disclosure can achieve several technical effects, such as a FinFET having a fin with a non-rectangular cross-section that increases the width of the device under the gate and therefore, the on current and the performance of the FinFET, without complicated and expensive processes of fabrication. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming at least two shallow trench isolation (STI) regions, filled with dielectric material, adjacent to but separate from each other in a silicon substrate;
    epitaxially growing a silicon-based layer between each adjacent pair of STI regions to form a fin with a non-rectangular cross-section extending from each STI region to each adjacent STI region;

forming a gate oxide over and perpendicular to each fin;

forming a gate electrode over the gate oxide to form a FinFET; and performing a well implantation between each pair of adjacent STI regions either prior to epitaxially growing the silicon-based layer, subsequent to epitaxially growing the silicon-based layer but prior to forming the gate oxide, or prior to anisotropically wet etching the silicon substrate, wherein the epitaxially grown silicon-based layer forms a fin with a diamond-shaped cross-section between each pair of adjacent STI regions, the diamond-shaped cross section comprising two sides meeting at a single point above the surface of the silicon substrate.

2. The method of claim 1, wherein the silicon substrate comprises a silicon-on-insulator (SOI) or bulk silicon substrate.

3. The method of claim 1, wherein the dielectric material is silicon dioxide ($SiO_2$).

4. The method of claim 1, wherein the epitaxially grown silicon-based layer is p-type or n-type doped silicon.

5. The method of claim 1, further comprising anisotropically wet etching the silicon substrate from each STI region to each adjacent STI region to form a channel between each pair of adjacent STI regions and epitaxially growing the silicon-based layer in each channel.

6. The method of claim 5, further comprising planarizing the silicon substrate by chemical-mechanical planarization (CMP) prior to anisotropically wet etching the silicon substrate.

7. The method of claim 5, comprising anisotropically wet etching the silicon substrate with potassium hydroxide (KOH), ethylene diamine and pyrocatechol (EDP), or tetramethylammonium hydroxide (TMAH).

8. A FinFET comprising:
a silicon substrate;
at least two adjacent but separate shallow trench isolation (STI) regions in the silicon substrate;
a channel formed in the silicon substrate extending from each STI region to each adjacent STI region, the channel having a trapezoidal cross-section;
a fin with a non-rectangular cross-section filling and extending above each channel, wherein each fin is an epitaxially grown silicon-based layer;
a gate oxide over and perpendicular to each fin; and
a gate electrode over the gate oxide,
wherein the non-rectangular cross-section of each fin comprises a diamond-shaped cross-section in each channel, the diamond-shaped cross section comprising two sides meeting at a single point above the surface of the silicon substrate.

9. The FinFET of claim 8, wherein the silicon substrate comprises a silicon-on-insulator (SOI) or bulk silicon substrate.

10. The FinFET of claim 8, further comprising at least one additional gate electrode over and perpendicular to each fin, wherein the FinFET is a multi-gate FinFET.

11. A FinFET comprising:
a silicon substrate;
at least two adjacent but separate shallow trench isolation (STI) regions in the silicon substrate;
a fin with a non-rectangular cross-section extending above the silicon substrate extending from each STI region to each adjacent STI region, wherein each fin is an epitaxially grown silicon-based layer;
a gate oxide over and perpendicular to each fin; and
a gate electrode over the gate oxide,
wherein the non-rectangular cross-section of the fin comprises a diamond-shaped cross-section between the at least two adjacent STI regions, the diamond-shaped cross section comprising two sides meeting at a single point above the surface of the silicon substrate.

12. The FinFET of claim 11, wherein the silicon substrate comprises a silicon-on-insulator (SOI) or bulk silicon substrate.

13. The FinFET of claim 11, further comprising at least one additional gate electrode over and perpendicular to each fin, wherein the FinFET is a multi-gate FinFET.

* * * * *